(12) United States Patent
Sandvik et al.

(10) Patent No.: US 10,078,143 B2
(45) Date of Patent: Sep. 18, 2018

(54) SOLID STATE PHOTOMULTIPLIER WITH WIDE TEMPERATURE RANGE OF OPERATION

(71) Applicant: General Electric Company, Schenectady, NY (US)

(72) Inventors: Peter Micah Sandvik, Niskayuna, NY (US); Stanislav Ivanovich Soloviev, Ballston Lake, NY (US); Sergei Ivanovich Dolinsky, Clifton Park, NY (US); James Jay McMahon, Clifton Park, NY (US); Sabarni Palit, Guilderland, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 236 days.

(21) Appl. No.: 14/986,001

(22) Filed: Dec. 31, 2015

(65) Prior Publication Data

US 2017/0192112 A1 Jul. 6, 2017

(51) Int. Cl.
*G01T 1/24* (2006.01)
*H01L 31/115* (2006.01)

(52) U.S. Cl.
CPC .............. *G01T 1/248* (2013.01); *G01T 1/249* (2013.01); *H01L 31/115* (2013.01)

(58) Field of Classification Search
CPC ........ G01T 1/248; G01T 1/249; H01L 31/115
See application file for complete search history.

(56) References Cited

U.S. PATENT DOCUMENTS

| | | | |
|---|---|---|---|
| 6,650,170 B1* | 11/2003 | Uzelac | H01L 27/0629 257/E27.016 |
| 7,403,589 B1 | 7/2008 | Short et al. | |
| 8,399,848 B2 | 3/2013 | Frach et al. | |
| 8,405,020 B2 | 3/2013 | Menge | |
| 2015/0285921 A1* | 10/2015 | Shah | G01R 33/481 600/411 |
| 2015/0285942 A1* | 10/2015 | Soloviev | E21B 47/00 250/261 |

FOREIGN PATENT DOCUMENTS

JP 2003142724 A 5/2003

OTHER PUBLICATIONS

Prochazka et al., "Single photon counting module for space applications", Journal of Modern Optics, 54.2-3, Jan. 2007, pp. 151-161.
(Continued)

*Primary Examiner* — David Porta
*Assistant Examiner* — Mindy Vu
(74) *Attorney, Agent, or Firm* — GE Global Patent Operation; Pabitra Chakrabarti

(57) ABSTRACT

A solid state photomultiplier includes at least one microcell configured to generate an initial analog signal when exposed to optical photons. The solid state photomultiplier further includes a quench circuit electrically coupled with the at least one microcell. The quench circuit includes at least one quench resistor configured to exhibit a substantially constant temperature coefficient of resistance over a selected temperature range.

19 Claims, 6 Drawing Sheets

(56) References Cited

OTHER PUBLICATIONS

Itzler et al., "Single-photon detectors based on InP avalanche diodes: status and prospects", Proceedings of SPIE—The International Society for Optical Engineering, vol. 7681, Apr. 2010.
Gallivanoni et al., "Monolithic active quenching and picosecond timing circuit suitable for large-area single-photon avalanche diodes", Optics Express, vol. 14, No. 12, pp. 5021-5030, 2006; ISSN: 10944087, E-ISSN: 10944087; DOI: 10.1364/OE.14.005021; Publisher: Optical Society of American (OSA).
Prochazka, "Peltier-cooled and actively quenched operation of InGaAs/InP avalanche photodiodes as photon counters at a 1.55-µm wavelength", Applied Optics, vol. 40, No. 33, pp. 6012-6018, Nov. 20, 2001; ISSN: 00036935, E-ISSN: 15394522; Publisher: Optical Society of America.
"Frach et al., The digital silicon photomultiplier—System architecture and performance evaluation", Nuclear Science Symposium Conference Record (NSS/MIC), 2010 IEEE Year: 2010 pp. 1722-1727, DOI: 10.1109/NSSMIC.2010.5874069.

\* cited by examiner

SOLID STATE PHOTOMULTIPLIER WITH WIDE TEMPERATURE RANGE OF OPERATION

BACKGROUND

The field of this disclosure relates generally to detection systems for use in imaging systems, and more specifically, to solid-state photomultipliers having a wide temperature range of operation in a detection system.

Many known imaging detector systems use a solid-state photomultiplier (SSPM) in combination with a scintillator. The scintillator converts x-rays and gamma rays to visible light photons whereupon a photodiode of the SSPM converts these photons to photocurrent. SSPMs have come to replace photomultiplier tubes (PMTs) in the field due to the SSPM's lower manufacturing costs, lower power requirements, compact size, mechanical durability, insensitivity to magnetic fields, and uniformity of response. SSPMs have become widely used as detection elements for computed tomography (CT), single photon emission computed tomography (SPECT), and positron emission tomography (PET) machines and applications. SSPMs have also become known for gamma ray detection in oil and gas drilling applications. High energy gamma rays reflected from Hydrogen (H) bearing compounds underground are indicative of petroleum-containing specific locations.

Most known SSPMs, however, are temperature dependent. Specifically, the typical SSPM integrates a dense array of small avalanche photodiodes (APD) operating in Geiger mode, i.e., well above the avalanche breakdown voltage. Each APD element in the array is often referred to as a "microcell", or "pixel", and each microcell has its own quenching resistor. The breakdown voltage ($V_{br}$) of the microcell is the bias point at which the electric field strength generated in a depletion region of the microcell is sufficient to create an avalanche breakdown. Each microcell generates a highly uniform and quantized amount of charge every time the microcell undergoes a avalanche breakdown. The breakdown voltage, though, changes as a function of temperature. That is, the gain of a given microcell depends at least in part on temperature. Thus, variations in gain due to temperature effects may lead to uncertainty with respect to the magnitude of the actual underlying event being measured.

To compensate for this temperature dependence, some known SSPMs require a cooling system, such as an additional Peltier device, to cool and regulate the temperature of the SSPM. Other known SSPMs utilize additional circuitry to adjust the bias voltage to maintain a constant over voltage with respect to the breakdown voltage. All of these solutions require additional hardware, which can increase the cost of the device. Additionally, even with this additional hardware, the typical SSPM is limited to moderate temperature environments, e.g., a hospital room with a PET scanner, where the SSPM can be easily cooled and/or regulated. The temperature dependence of an SSPM has made it difficult to utilize SSPMs in applications where a wide range of operational temperatures are experienced, such as with the gamma rays and neutron radiation detected in oil exploration drilling, for example, or the measurement of the flame from a gas turbine engine, which typically exhibit significantly harsher thermal environments. A typical oil well environment, for example, can experience shock levels near 250 times gravitational acceleration (G), and temperatures therein vary widely from below room temperature to above 175 degrees Celsius (° C.).

BRIEF DESCRIPTION

In one aspect, a solid state photomultiplier is provided. The solid state photomultiplier includes at least one microcell configured to generate an initial analog signal when exposed to optical photons. The solid state photomultiplier further includes a quench circuit electrically coupled with the at least one microcell. The quench circuit includes at least one quench resistor configured to exhibit a substantially constant temperature coefficient of resistance over a selected temperature range.

In another aspect, a radiation detector module is provided. The radiation detector module includes a scintillator layer configured to generate photons in response to incident radiation, and a solid state photomultiplier including a plurality of microcells and a plurality of quench circuits. Each microcell is electrically coupled with a respective quench circuit, and is configured to generate a digital pulse signal in response to photons generated by the scintillator layer. Each respective quench circuit includes a quench resistor configured to exhibit a substantially constant temperature coefficient of resistance over a selected temperature range.

In yet another aspect, an imaging system for a detecting radiation from a radiation source is provided. The imaging system includes a detector panel including a plurality of solid state photomultiplier modules. Each solid state photomultiplier module includes a plurality of microcell circuits. Each microcell circuit includes a photodiode responsive to the radiation from the radiation source, and a quench circuit configured to exhibit a substantially constant temperature coefficient over a selected temperature range. The imaging system further includes a data acquisition system configured to acquire output signals from the detector panel. The output signals are derived using digital pulses aggregated over respective solid state photomultiplier modules. The imaging system further includes an image reconstruction and processing system configured to generate images based on the output signals acquired by the data acquisition system, and at least one image display workstation configured to display the generated images from the image reconstruction and processing system.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION OF THE INVENTION

Figure 1:
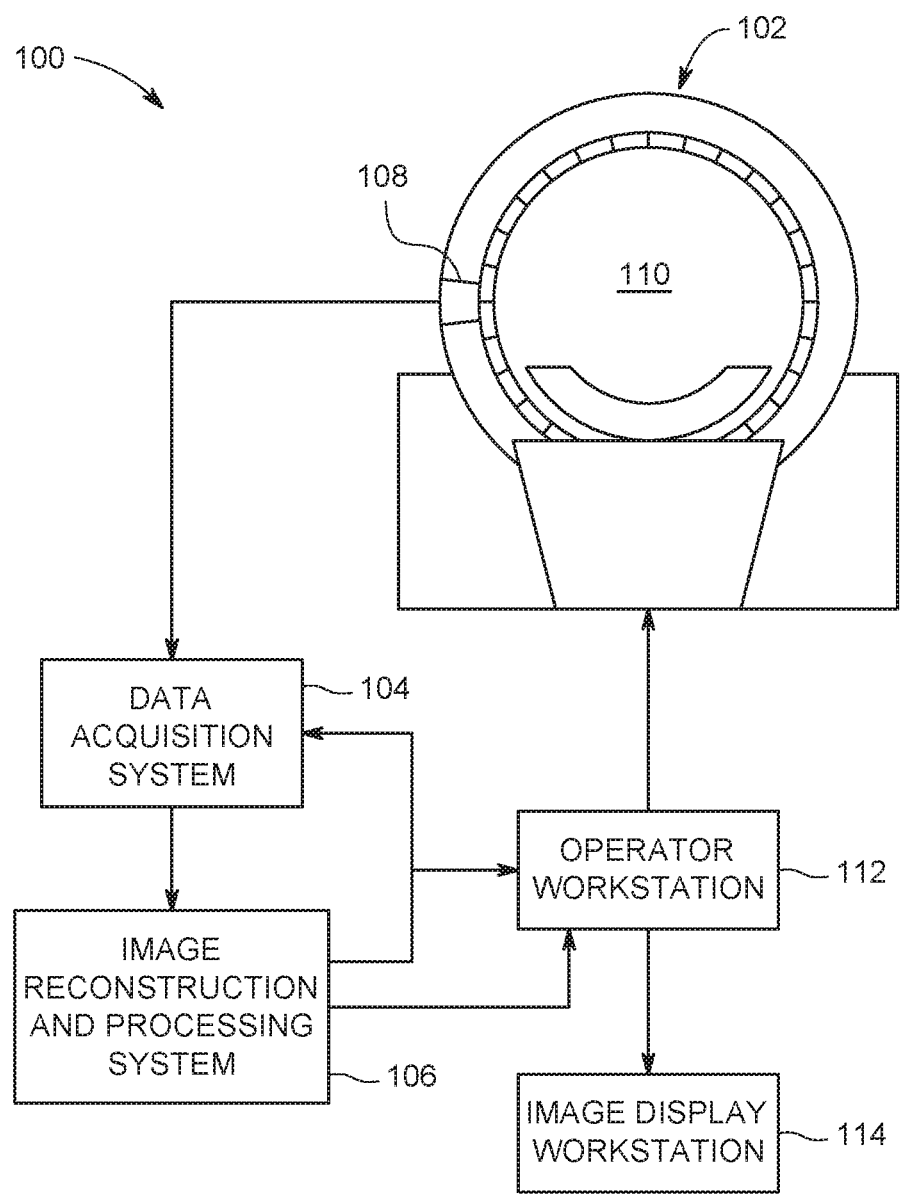
FIG. 1 is a diagrammatical representation of an exemplary positron emission tomography (PET) imaging system.

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, the terms "processor" and "computer," and related terms, e.g., "processing device," "computing device," and "controller" are not limited to just those integrated circuits referred to in the art as a computer, but broadly refer to a microcontroller, a microcomputer, a programmable logic controller (PLC), and application specific integrated circuit, and other programmable circuits, and these terms are used interchangeably herein. In the embodiments described herein, memory may include, but it not limited to, a computer-readable medium, such as a random access memory (RAM), a computer-readable non-volatile medium, such as a flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a mouse and a keyboard. Alternatively, other computer peripherals may also be used that may include, for example, but not be limited to, a scanner. Furthermore, in the exemplary embodiment, additional output channels may include, but not be limited to, an operator interface monitor.

Further, as used herein, the terms "software" and "firmware" are interchangeable, and include any computer program storage in memory for execution by personal computers, workstations, clients, and servers.

As used herein, the term "non-transitory computer-readable media" is intended to be representative of any tangible computer-based device implemented in any method of technology for short-term and long-term storage of information, such as, computer-readable instructions, data structures, program modules and sub-modules, or other data in any device. Therefore, the methods described herein may be encoded as executable instructions embodied in a tangible, non-transitory, computer-readable medium, including, without limitation, a storage device and/or a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including without limitation, volatile and non-volatile media, and removable and non-removable media such as firmware, physical and virtual storage, CD-ROMS, DVDs, and any other digital source such as a network or the Internet, as well as yet to be developed digital means, with the sole exception being transitory, propagating signal.

The systems and methods of the embodiments described herein are useful to implement a solid-state photomultiplier (SSPM) detector having a wide temperature range of operation. The improved SSPM is capable of maintaining a low light level detection, such as single photon detection, while exhibiting low dark current, or leakage, affects over the same wide temperature range. The improved SSPM retains the benefits realized by SSPMs over PMTs, such as improved timing resolution, compact size, and mechanical durability, while avoiding the temperature constraints on conventional SSPM designs and applications.

FIG. 1 illustrates a positron emission tomography (PET) system 100. PET system 100 is used in isolation or in conjunction with another imaging modality, such as a CT or MRI imaging system. Although a PET system is described and discussed herein, it should be appreciated that the present systems and methods are useful in other imaging contexts, such as in a SPECT imaging system or in an X-ray based imaging system, such as a mammography, fluoroscopy, computed tomography, tomosynthesis, or angiography system. The present systems and methods are also employable in conjunction with any nuclear radiation detector that is based on the use of scintillators with SSPM readout, including, without limitation, detectors for oil/gas drilling systems or a photodetector operated in a wide temperature range with SSPM readout, such as gas turbine engine flame measurement systems.

Returning now to FIG. 1, PET system 100 includes a detector assembly 102, a data acquisition system 104, and an image reconstruction and processing system 106. Detector assembly 102 of PET system 100 includes a plurality of detector modules 108 arranged about an imaging volume 110. Detector assembly 102, through detector modules 108, is configured to generate signals in response to gamma rays generated by positron annihilation events and emitted from a subject within imaging volume 110. According to an exemplary embodiment, detector assembly 102 includes a plurality of scintillators (not shown in FIG. 1, described below with respect to FIG. 3), respectively, as well as photon detection electronics (not shown in FIG. 1, described below with respect to FIG. 4). Detector assembly 102 is of suitable construction and configuration for acquiring PET data, such as, for example, a full or partial ring as shown in FIG. 1.

According to the exemplary embodiment, gamma rays are converted, such as in scintillator (not shown in FIG. 1, described below with respect to FIG. 3) of detector assembly 102 or detector modules 108, to lower energy photons that in turn are converted by detector modules 108 to electrical signals, which are then conditioned and processed to output digital signals. These output digital signals are used to match pairs of gamma ray detections as potential coincidence events. That is, in a PET system, when two gamma rays strike opposing detectors it is determined that a positron annihilation occurred somewhere on a line connecting the two impact locations (absent the effects of interactions of random and scatter detections). In SPECT implementations, line of flight information may instead be inferred based at least in part on the collimation associated with the detector assembly. The collected data can be sorted and integrated and used in subsequent processing such as by image reconstruction and processing system 106.

In operation, data acquisition system 104 reads signals from detector modules 108 of detector assembly 102, where the signals are generated in response to gamma rays emitted within imaging volume 110. The signals acquired by data acquisition system 104 are provided to image reconstruction and processing system 106, and image reconstruction and processing system 106 generates an image based on the derived gamma ray emission locations. An operator workstation 112 can be utilized by a system operator to provide control instructions to some or all of the components of PET system 100. Operator workstation 112 is further configured to process and control the various operating parameters that aid in data acquisition and image generation. In an exemplary embodiment, operator workstation 112 displays the generated image. In an alternative embodiment, the generated image is displayed at a remote location, such as an image display workstation 114.

To facilitate explanation and discussion of the operation of PET system 100, data acquisition system 104 and image reconstruction and processing system 106 are shown separate from other system components (i.e., detector assembly 102, operator workstation 112, and image display workstation 114). In certain embodiments of PET system 100, some or all of these components are integrated as part of detector assembly 102, operator workstation 112, and/or image display workstation 114. For example, the hardware, software, and/or firmware executed on, or provided as part of, data acquisition system 104, whether provided as part of detector assembly 102, operator workstation 112, and/or image display workstation 114, may be used to perform various detector readout and/or control actions described herein.

According to an exemplary embodiment, data acquisition system 104 includes specially configured or programmed hardware, memory, and/or processors (e.g., application-specific integrated circuits (ASICs), described further below with respect to FIG. 2) for performing gain compensation as discussed herein. Additionally, certain of these compensation functions may be performed using one or more general or special purpose processors and stored code or algorithms configured to execute on such processors. Alternatively, a combination of special purpose hardware and/or circuitry may be used in conjunction with one or more processors configured to execute stored code to implement the detection, image reconstruction, control, and display processes discussed herein.

Referring back to FIG. 1, according to an exemplary embodiment, PET system 100 utilizes arrays of solid-state photo sensors (not shown in FIG. 1, described further below) as part of the gamma ray detection mechanism, i.e., as part of detector modules 108. In the exemplary embodiment, these photo sensors are SSPM devices, e.g., an array of passively quenched Geiger-mode avalanche photodiodes (APD) for detecting impinging photons. In general, SSPM devices used for photon detection provide information about certain parameters of the detected radiation event, such as the time of the impingement event, the energy associated with the event, and the position of the event within the detector. These parameters are determined through processing algorithms applied to the signals generated by the SSPM.

Figure 2:
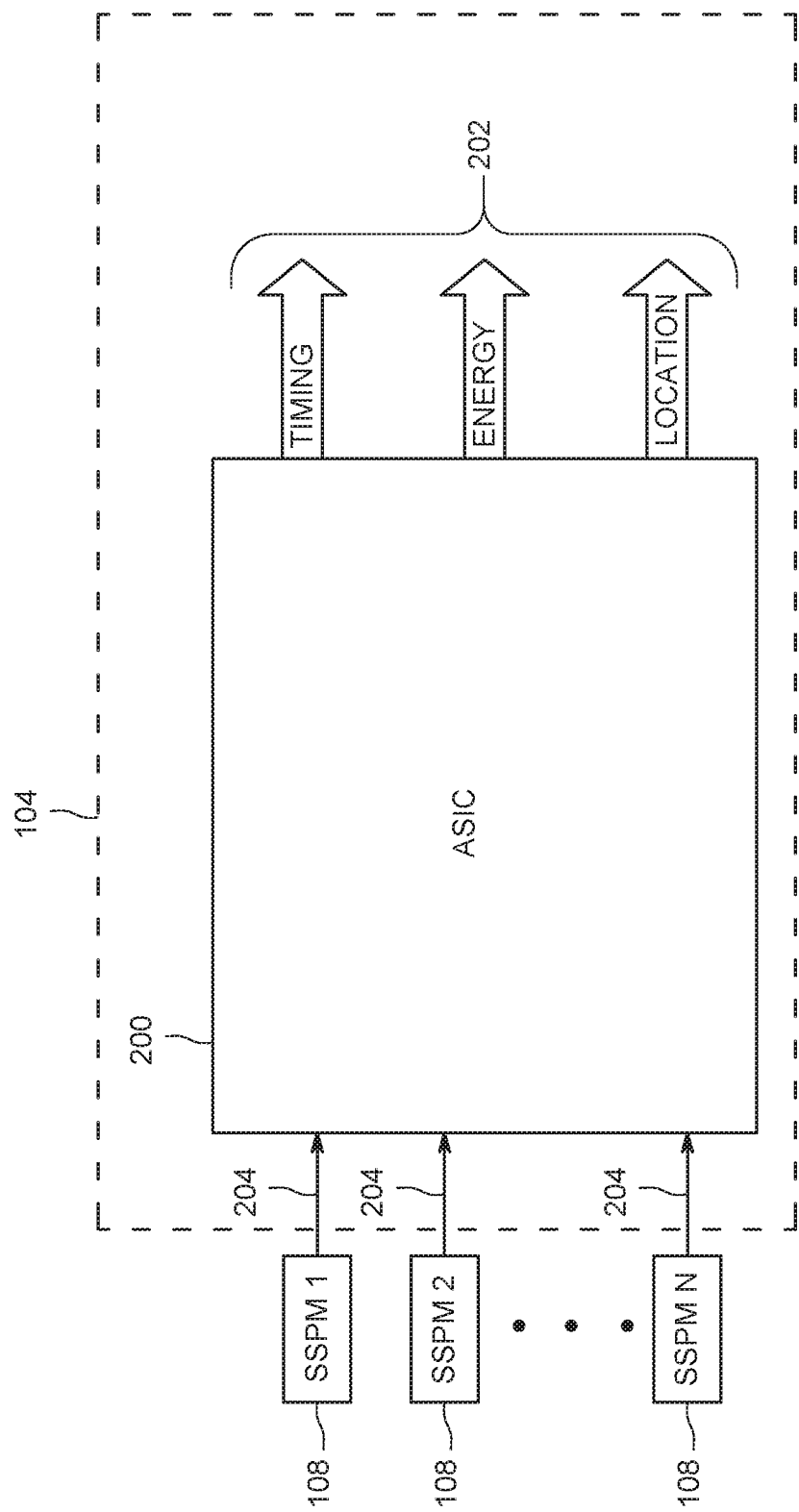
FIG. 2 is a block diagram of an exemplary front-end for the PET data acquisition system shown in FIG. 1.

Referring now to FIG. 2, an exemplary embodiment of data acquisition system 104 is provided. Data acquisition system 104 includes an array of N SSPM detector modules 108, which interface with a multichannel readout front-end application-specific integrated circuit (ASIC) 200, which are implemented in PET (or SPECT) system 100, as well as the other applications described above. In the exemplary embodiment, ASIC 200 is provided as an integral component of data acquisition system 104 and provides ASIC output information 202 on the timing, energy, and location of events in each detector module 108 to a processing system, e.g., image reconstruction and processing system 106. ASIC 200 is further configured to provide a bias voltage to each detector module 108.

In an exemplary embodiment, data acquisition system 104 includes at least one ASIC 200, which is in electrical or electronic data communication with a plurality of detector modules 108. In an alternative embodiment, ASIC 200 is an integral component of detector modules 108, and in electronic communication, direct or wireless, with data acquisition system 104. Light generated in response to a gamma ray interaction is detected by a detector module 108 and amplified. In this example, each detector module 108 includes an anode output 204 in electrical communication with ASIC 200. That is, anode output 204 of detector modules 108 are the inputs to the respective ASIC 200. ASIC 200 in turn provides one or more timing signals, energy signals, and/or position signals as ASIC output information 202. Each of ASIC output information 202 corresponds to information obtained from respective detector modules 108 after processing by ASIC 200. By way of a non-limiting example, in an embodiment, data acquisition system 104 includes eighteen (18) detector modules 108. That is, N=18. Alternatively, in other embodiments, different quantities of detector modules 108 are implemented with or within data acquisition system 104, where N=10,000 or more.

Figure 3:
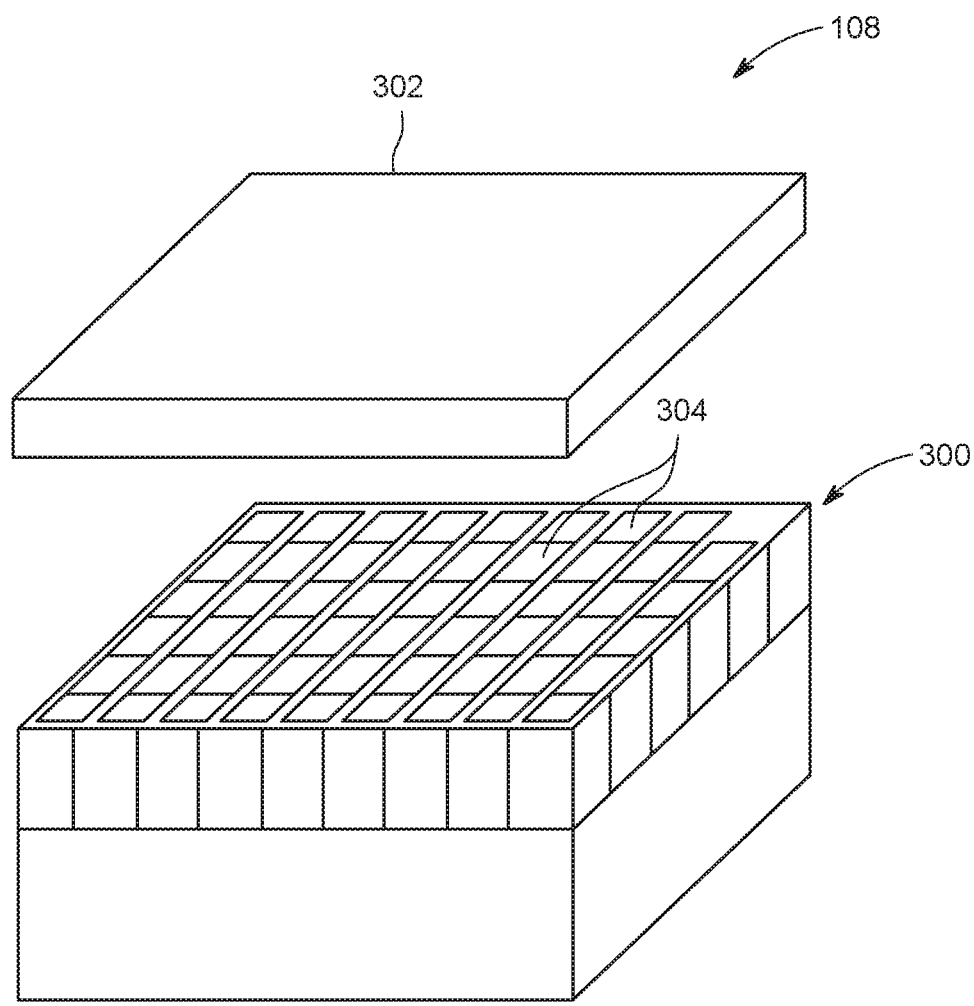
FIG. 3 is a perspective view of an exemplary solid state photomultiplier (SSPM) detector element utilized in the PET imaging system shown in FIG. 1.

Referring now to FIG. 3, a perspective view of an exemplary detector module 108 is provided. Detector module 108 includes an SSPM detector element 300, sometimes referred to as a "pixel", and a scintillator 302. SSPM detector element 300 is formed of a plurality of avalanche photodiodes (APDs), or "microcells", 304 that amplify single optical photon arrivals from scintillator 302. According to the exemplary embodiment, SSPM detector element 300 includes a large number of microcells 304 (e.g., between 100 to 2,500 APDs per square millimeter ($mm^2$)). Each microcell 304 has, for example, without limitation, a length of between 20 microns to 100 microns, and operates as an individual Geiger-mode APD with a voltage potential of a few volts above the breakdown voltage $V_{br}$. Each microcell 304 is virtually identical to other microcells in SSPM detector element 300. In an exemplary embodiment, microcell 304 is fabricated of a wide bandgap semiconductor material.

In operation, an electron generated by the absorption of an optical photon initiates an avalanche breakdown that is confined to an individual microcell 304 when the one or more photons are absorbed by that microcell 304. Each microcell 304 functions independently of other microcells 304 to detect photons. A single discrete unit of electrical charge is emitted from individual microcell 304 independent of the number of photons absorbed therein. That is, for each Geiger breakdown, the output signal of microcell 304 will have substantially the same shape and charge. In an exemplary embodiment, microcells 304 are electrically connected in parallel to yield an integrated charge over a given area over which the signals are being aggregated, such as a SSPM detector element 300. The summed discharge currents of the electrically microcells 304 are indicative of the incidence of radiation over the given area. This quasi-analog output is capable of providing magnitude information regarding the incident photon flux over the area for which signals are being aggregated.

Figure 4:
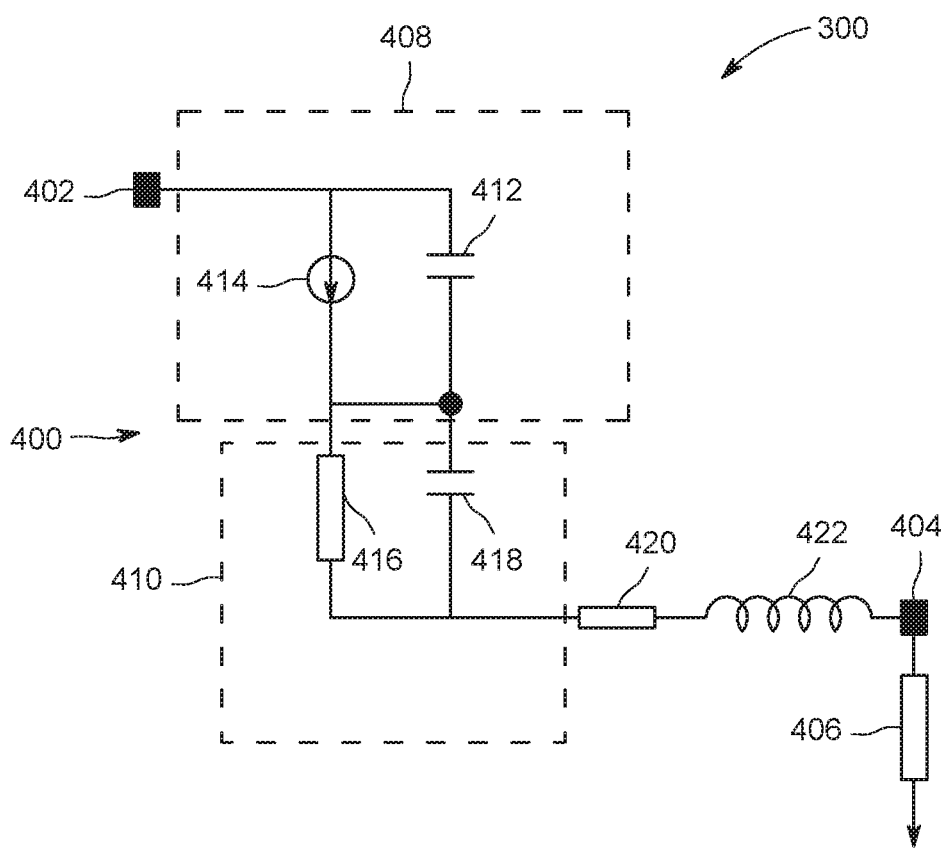
FIG. 4 is a simplified electrical model of a microcell signal generating path for the SSPM detector element shown in FIG. 3.

Referring now to FIG. 4, a simplified electrical model 400 is provided of an exemplary microcell signal generating path for SSPM detector element 300. In the exemplary embodiment, microcell 304 is one of a plurality of microcells within an array of such microcells, e.g., SSPM detector element 300, and is a single photon avalanche diode (SPAD) operating in Geiger mode within an analog SSPM. Electrical model includes an associated cathode 402, an anode 404, and a downstream load 406. Electrical model 400 further includes a microcell circuit portion 408 and a quench circuit portion 410 electrically coupled to microcell circuit portion 408. Microcell circuit portion 408 electrically models the APD of an individual microcell 304, and includes a diode capacitor 412 and a pulse current 414. Quench circuit portion 410 includes a quench resistor 416 and a parasitic quench capacitor 418. Optionally, and electrically downstream of quench circuit portion 410, for example, is a parasitic resistor 420 and parasitic inductor 422.

In the exemplary embodiment, each individual APD of an individual microcell 304, i.e., microcell circuit portion 408, is connected to a readout network, i.e., at anode 404, through quench circuit portion 410, including quench resistor 416. In operation, when a detected photon generates an avalanche event, pulse current 414 is generated, diode capacitor 412 discharges down to the breakdown voltage $V_{br}$, and the recharging current creates a measurable output signal. Thus, microcell 304 is configured to generate an analog signal when exposed to optical photons. According to the exemplary embodiment, a pulse shape of a single photo electron (SPE) signal has a fast rise time (i.e., a sharp rising edge) followed by a long fall time (i.e., a slow falling tail). According to the exemplary embodiment, microcell 304 of has a band gap greater than about 1.7 electron volts (eV) at 25° C. As described below with respect to FIG. 5, in the exemplary embodiment, the configuration of quench resistor 416 avoids much of the temperature limitations of a conventional SSPM microcell.

Figure 5:
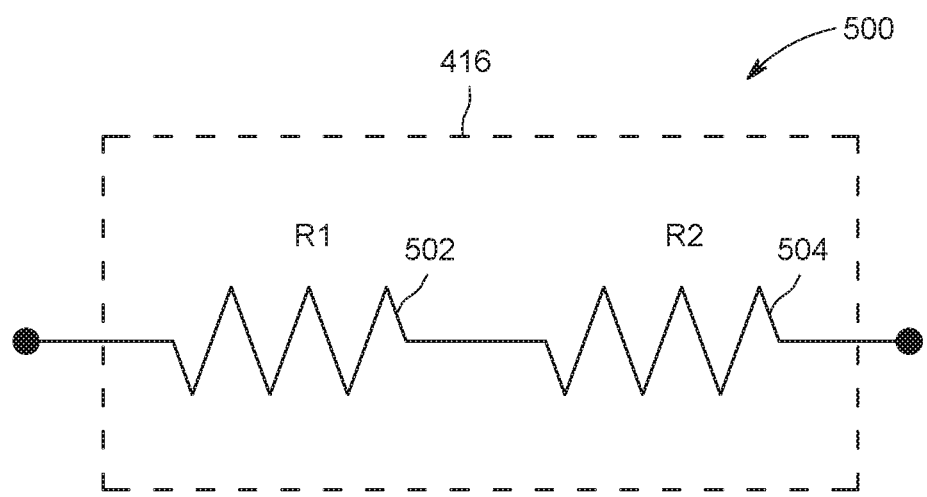
FIG. 5 is a simplified electrical model of an exemplary quench resistor in the model shown in FIG. 4.

Referring now to FIG. 5, a simplified electrical model 500 of quench resistor 416 is provided, in accordance with an exemplary embodiment. Quench resistor 416 includes a first resistor 502 ($R_1$) in series with a second resistor 504 ($R_2$). First resistor 502 is fabricated of a material exhibiting a positive temperature coefficient (PTC) of resistance, such as, and without limitation, silicon carbide (SiC), a PTC silicide, or a polysilicon having a high doping concentration. Some such PTC resistors are also known as PTC thermistors, and are made semi-conductive by the addition of dopants. Second resistor is fabricated of a material exhibiting a negative temperature coefficient (NTC) of resistance, such as, and without limitation, a polysilicon having a relatively low doping concentration.

In the exemplary embodiment, the semiconductor materials of first resistor 502 and second resistor 504 are chosen from silicon-based materials exhibiting a substantially constant PTC and NTC, respectively, over a given temperature range, such as from −60 degrees Celsius (° C.) to 300° C. Such silicon-based resistors are sometimes referred to as silicon semiconductor resistors, also known as "silistors", which exhibit resistance increases (PTC) or decreases (NTC) in a substantially linear manner in proportion to temperature increase, as described further below with respect to FIG. 6. In an alternative embodiment, first resistor 502 and second resistor 504 are fabricated of materials chosen from thermo-sensitive ceramic materials, indium tin oxide (ITO), or different metal oxides, such as MnO, CoO, NiO, etc., depending on the reference resistance of the material, as well as the magnitude and vector of its temperature coefficient.

Figure 6:
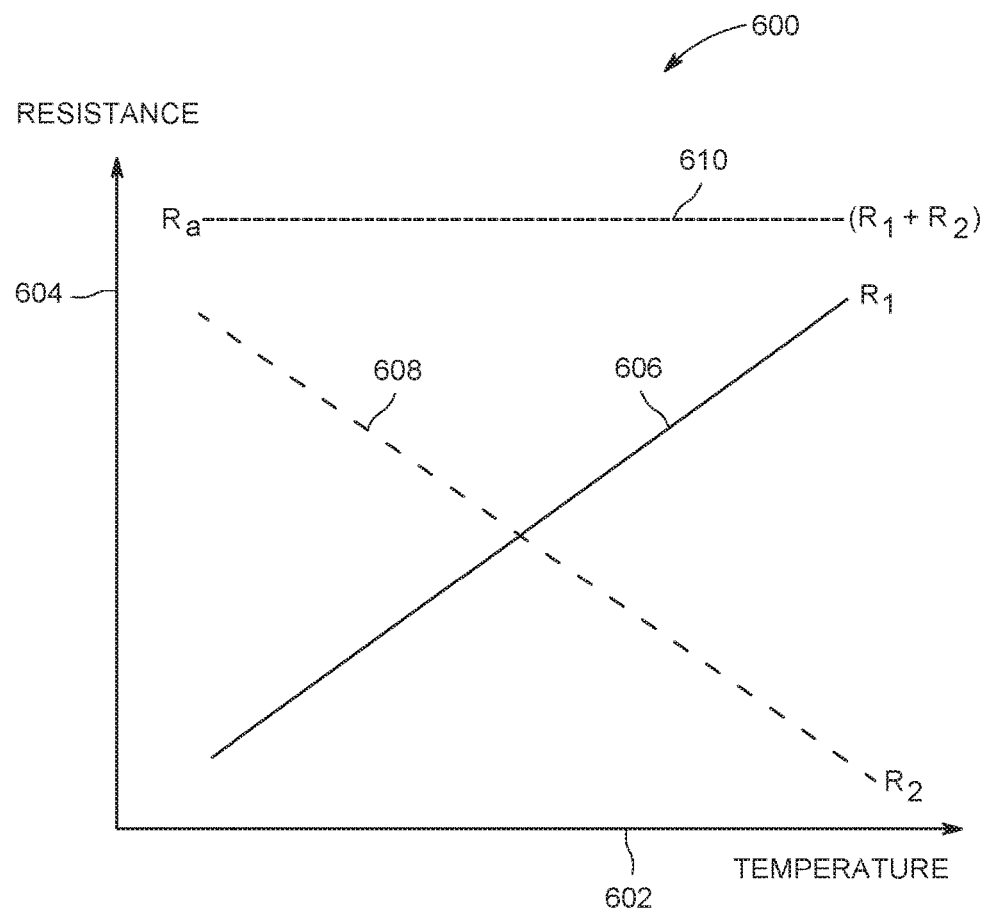
FIG. 6 is a graphical representation comparing temperature responses of exemplary resistor elements of an exemplary quench circuit in the model shown in FIG. 4.

FIG. 6 is a graphical representation comparing temperature responses of first and second resistors 502, 504, shown in FIG. 5, of quench circuit portion 410, shown in FIG. 4, according to an exemplary embodiment. Referring to FIG. 6, a resistance response graph 600 includes an x-axis 602 (longitudinal direction) representing temperature in units of degrees Celsius (° C.), and a y-axis 604 (height dimension) representing resistance, in units of ohms (Ω).

Response graph 600 includes a first temperature response plot 606 of first resistor 502, which has a positive linear response for a PTC resistor conforming generally to the following calculation:

$$R_1 = R_{ref1}(1 + \alpha_1 \Delta T) \quad \text{(Eq. 1)}$$

where $R_1$ is the resistance of first resistor 500 over temperature, $R_{ref1}$ is the resistance of first resistor 502 at a reference temperature, e.g., room temperature (20° C.), $\alpha_1$ is the magnitude of the temperature coefficient of resistance, in units of Ω/° C., for the material of first resistor 502, and T is the temperature.

Response graph 600 further includes a second temperature response plot 608 of second resistor 504, which has a negative linear response for an NTC resistor conforming generally to the following calculation:

$$R_2 = R_{ref2}(1 - \alpha_2 \Delta T) \quad \text{(Eq. 2)}$$

where $R_2$ is the resistance of second resistor 504 over temperature, $R_{ref2}$ is the resistance of second resistor 504 at a reference temperature, e.g., room temperature (20° C.), $\alpha_2$ is the magnitude of the temperature coefficient of resistance, in units of Ω/° C., for the material of second resistor 504, and T is again the temperature. The coefficient $\alpha_2 T$ is subtracted from the reference resistance $R_{ref2}$ in this calculation because second resistor 502 is an NTC resistor, that is, $\alpha_2$ has a negative vector.

When first resistor 502 and second resistor 504 are placed in series, as shown in FIG. 5, the resistance $R_Q$ of quench resistor 416 is calculated as follows:

$$R_Q = R_1 + R_2 \quad \text{(Eq. 3)}$$

which, by combining equations 1 and 2, above, can be rewritten as follows:

$$R_Q = R_{ref1} + R_{ref2} + R_{ref1}\alpha_1 \Delta T - R_{ref2}\alpha_2 \Delta T \quad \text{(Eq. 4)}$$

Thus, the materials for first resistor 502 and second resistor 504 are selected such that $R_{ref1}\alpha_1$ and $R_{ref2}\alpha_2$ have substantially the same magnitude, but opposite vectors for the PTC $\alpha_1$ and the NTC $\alpha_2$, such that $R_{ref1}\alpha_1 - R_{ref2}\alpha_2$ equals zero. Accordingly, with this balancing between first resistor 502 and second resistor 504, temperature response plot 610 for quench resistor 416 is substantially constant, that is, substantially just the sum of $R_{ref1} + R_{ref2}$ over the selected temperature range. By this configuration of series quench resistor of opposite-vector temperature coefficient materials, the temperature dependence of the SSPM, i.e., SSPM detector element 300, is effectively avoided over the temperature range, and the need for additional cooling elements or systems is removed.

Additionally, with respect to the analog pulse generated by SSPM detector element 300, the time constant of slow components of the pulse drops with increased temperature, while the peak amplitude of the output pulse signal increases. Moreover, the fast component of the output waveform pulse becomes more negligible as temperature increases. Thus, implementation of first resistor 502 and second resistor 504 having opposing temperature coefficients mitigates the temperature dependence exhibited by conventional SSPM elements, but without significantly altering the shape of the output analog pulse waveform.

In the exemplary embodiment, $R_{ref1}\alpha_1$ and $R_{ref2}\alpha_2$ have substantially the same magnitude such that $R_Q$ is generally constant within a desired tolerance range. According to this embodiment, $R_{ref1}\alpha_1$ and $R_{ref2}\alpha_2$ are selected such that $R_Q$ has a substantially constant resistance that varies no more than twenty percent from the sum of $R_{ref1}+R_{ref2}$ over the selected temperature range. In an alternative embodiment, first resistor 502 is not a single resistor, but instead a series of two or more sub-resistors, each having a PTC of a different magnitude than $\alpha_1$, but where the combination of all sub-resistor PTCs in the series is equivalent to $\alpha_1$. Similarly, second resistor 504 also need not be a single resistor, but instead can be a series of two or more sub-resistors, each having a NTC of a different magnitude than $\alpha_2$, but where the combination of all sub-resistor NTCs in the series is equivalent to $\alpha_2$.

Figure 7:
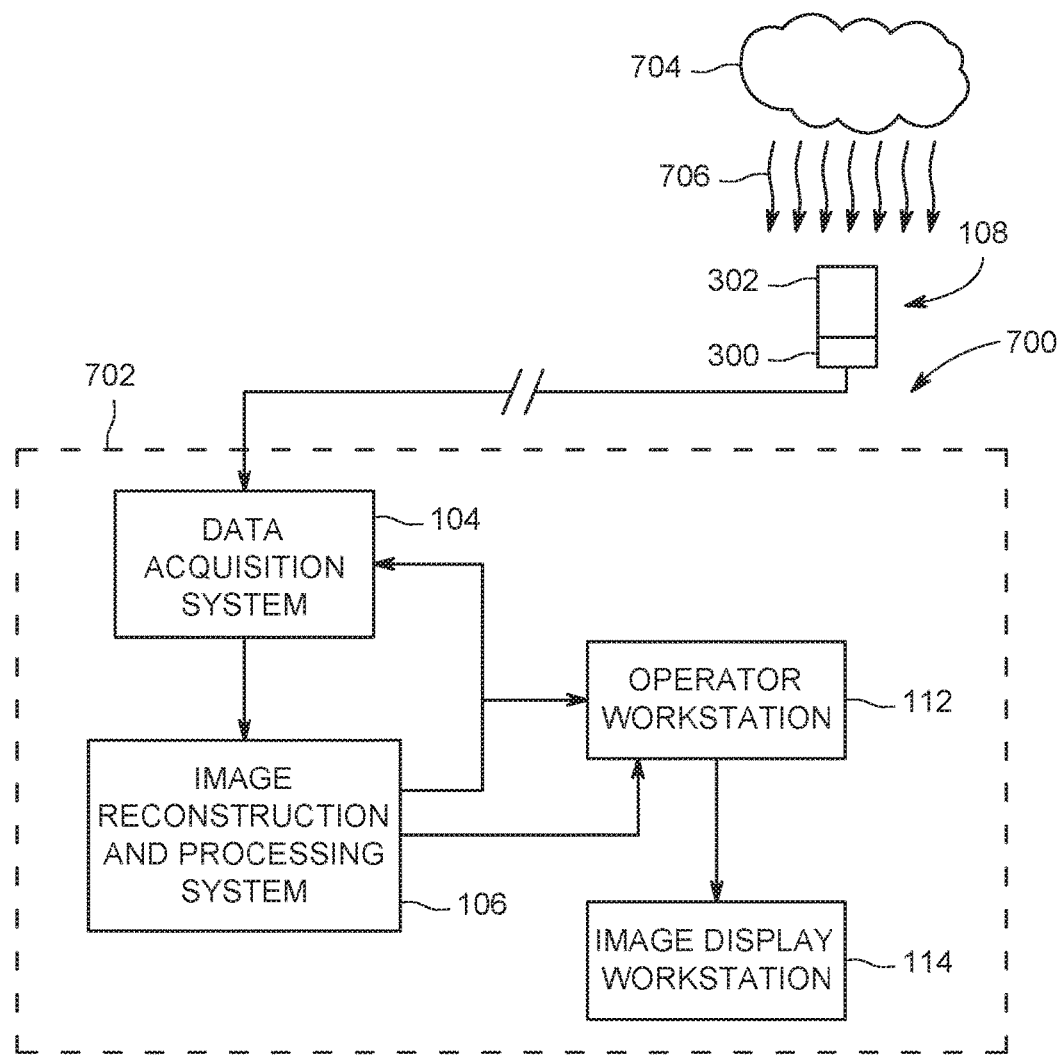
FIG. 7 is a diagrammatical representation of an alternative imaging system utilizing the SSPM detector shown in FIG. 3.

FIG. 7 is a diagrammatical representation of an alternative imaging system 700 utilizing the same SSPM detector element 300 shown in FIG. 3, and further described with respect to FIGS. 4-6. Imaging system 700 includes SSPM detector module 108, which itself includes scintillator 302 and SSPM detector element 300, in electric or electronic data communication with data acquisition system 104 of an acquisition, processing, and display sub-system 702. SSPM detector module 108 can include one or more individual SSPM detector modules, such as in an array, and sub-system 702 further includes image reconstruction and processing system 106, operator workstation 112, and image display workstation 114. Except for the lack of a particular configuration for a detector assembly, e.g., detector assembly 102, shown in FIG. 1, and the different radiation source detected, imaging system 700 is the same as PET imaging 100, shown in FIG. 1. The individual components of sub-system 702 are therefore the same as their counterparts shown in FIG. 1, except for some potentially different general or special purpose processors and stored code or algorithms configured to execute on such processors for the different radiation source. In an alternative embodiment, sub-system 702 is a meter configured to measure and record and/or transmit the amount of electric current produced by SSPM detector module 108.

In the example shown in FIG. 7, SSPM detector module 108 is oriented toward a source 704, e.g., a rock, that emits high energy radiation 706, such as gamma rays or x-rays. The emission of high energy radiation 706 from source 704 is indicative of a sought substance, e.g., oil. More specifically, the higher the level of radiation measured, the more likely it is that oil is present. In the exemplary embodiment, imaging system 700 includes a single SSPM detector module 108. Alternatively, imaging system 700 includes an array of SSPM detector module 108. In operation, scintillator 302 is configured to convert high energy radiation 706 into photons that impinge upon SSPM element 300, which in turn converts the received photons into electrical or electronic signals that are transmitted directly, or by wireless transmission, to sub-system 702. In an alternative embodiment, scintillator 302 is a material, such as a phosphor, which, when excited by high energy radiation 706, is capable of emitting light readable by SSPM element 300.

In an alternative embodiment of the example shown in FIG. 7, source 704 is light generated by a flame from a gas engine (not shown). Sub-system 702, in this alternative, need not include complete electronics for an imaging system, but instead sufficient electronics to form a flame diagnostic system. Even with the broader temperature operational abilities of the embodiments described herein, the heat generated by an engine flame can still be of a range 2-10 times hotter than the uppermost operational range of the present SSPMs, i.e., around 300° C. Nevertheless, distinct advantages are realized by the present embodiments over conventional SSPM systems. In flame measurement operations, for example, the conventional SSPM must be typically removed to a significant distance remote from the flame testing environment, such as in a temperature-controlled room kept at standard room temperatures. According to the advantageous embodiments herein though, the SSPM detector is fully capable of a range of function beyond even the limits of human tolerance. This greater versatility will greatly increase the lifespan, reliability, and the utility of the SSPM manufactured according to the embodiments herein.

The above-described integrated sensors and associated sensing systems facilitate extended operation in harsh environments. Specifically, integrating a significant portion of sensing system components in high-temperature and rotatable components during the manufacture of such components reduces the amount of time and resources expended in preparing the high-temperature and rotatable components for insertion into the respective turbomachine after they are manufactured. Further, specifically, the integrated sensors and associated sensing systems described herein include substrate materials and dielectric materials integrated as part of the sensors such that the sensors may be positioned on components, or portions of component, that do not have sufficient substrate and dielectric materials to accept known sensors. Such integration of the sensors with the components includes adding the necessary substrate and/or dielectric materials to the sensors as sensing device features to facilitate placement of the sensors in regions that would otherwise frustrate use of such sensors thereon. Therefore, such integration of the sensors and components facilitates placing the sensors at the most appropriate and desired positions on the components. Further, such integration of the sensors and high-temperature and rotatable components will increase the hurdles to non-OEM (original equipment manufacturer) entities for attempted duplication.

An exemplary technical effect of the methods, systems, and apparatus described herein includes at least one of: (a) integrating sensing system devices in components during the manufacture of such components, thereby reducing the amount of time and resources expended in preparing the components for insertion into the respective machines after they are manufactured; (b) facilitating placement of the sensor components at the most appropriate and desired positions on the high-temperature and rotatable components; (c) positioning sensors in harsh environments that do not have delicate chip features, thereby facilitating more robust sensing devices; (d) providing sensors that embedded within the associated components during manufacture and are not affixed to their associated components subsequent to manufacturing of those components, thereby facilitating sturdier sensing devices; and (e) facilitating passive operation of a machine sensor in a wireless environment.

Exemplary embodiments of methods, systems, and an apparatus for reducing temperature dependence of solid state photomultipliers are not limited to the specific embodiments described herein, but rather, components of systems and/or steps of the methods may be utilized independently and separately from other components and/or steps described herein. For example, the systems and methods may also be used in addition to other imaging systems for detecting radiation from a radiation source and the like, and are not limited to practice with only the systems and methods as described herein. Rather, the exemplary embodiment can be implemented and utilized in addition to many other solid state photomultiplier imaging applications, equipment, and systems.

Although specific features of various embodiments of the invention may be shown in some drawings and not in others, this is for convenience only. In accordance with the principles of the invention, any feature of a drawing may be referenced and/or claimed in combination with any feature of any other drawing.

Some embodiments involve the use of one or more electronic or computing devices. Such devices typically include a processor, processing device, or controller, such as a general purpose central processing unit (CPU), a graphics processing unit (GPU), a microcontroller, a reduced instruction set computer (RISC) processor, an application specific integrated circuit (ASIC), a programmable logic circuit (PLC), a field programmable gate array (FPGA), a digital signal processing (DSP) device, and/or any other circuit or processing device capable of executing the functions described herein. The methods described herein may be encoded as executable instructions embodied in a computer readable medium, including, without limitation, a storage device and/or a memory device. Such instructions, when executed by a processing device, cause the processing device to perform at least a portion of the methods described herein. The above examples are exemplary only, and thus are not intended to limit in any way the definition and/or meaning of the term processor and processing device.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A solid state photomultiplier comprising:
   at least one microcell configured to generate an initial analog signal when exposed to optical photons; and
   a quench circuit electrically coupled with said at least one microcell, said quench circuit comprising at least one quench resistor configured to exhibit a substantially constant resistance over a selected temperature range, wherein said at least one quench resistor comprises at least one first resistor configured to exhibit a primary positive temperature coefficient of resistance and at least one second resistor configured to exhibit a primary negative temperature coefficient of resistance.

2. The solid state photomultiplier of claim 1, wherein said primary positive temperature coefficient of resistance and said primary negative temperature coefficient of resistance are selected such that said substantially constant resistance varies less than twenty percent from the sum of a first impedance value of said first resistor plus a second impedance value of said second resistor over the selected temperature range.

3. The solid state photomultiplier of claim 1, wherein said at least one first resistor comprises at least two positive sub-resistors, each positive sub-resistor of said at least two positive sub-resistors configured to exhibit an absolute value of a positive temperature coefficient of resistance different than an absolute value of said primary positive temperature coefficient of resistance.

4. The solid state photomultiplier of claim 1, wherein said at least one second resistor comprises at least two negative sub-resistors, each negative sub-resistor of said at least two negative sub-resistors configured to exhibit an absolute value of a negative temperature coefficient of resistance different than an absolute value of said primary negative temperature coefficient of resistance.

5. The solid state photomultiplier of claim 1, wherein said at least one first resistor comprises a silicide material.

6. The solid state photomultiplier of claim 5, wherein said silicide material is silicon carbide.

7. The solid state photomultiplier of claim 1, wherein said at least one second resistor comprises a polysilicon material.

8. The solid state photomultiplier of claim 1, wherein said at least one second resistor comprises an indium tin oxide material.

9. The solid state photomultiplier of claim 1, wherein the selected temperature range extends from and includes −60 degrees Celsius (° C.) to and includes 300° C.

10. The solid state photomultiplier of claim 1, wherein said solid state photomultiplier further comprises a wide bandgap material.

11. The solid state photomultiplier of claim 1, wherein said at least one microcell comprises at least one avalanche photodiode.

12. A radiation detector module comprising:
    a scintillator layer configured to generate photons in response to incident radiation; and
    a solid state photomultiplier comprising a plurality of microcells and a plurality of quench circuits, each said microcell of said plurality of microcells electrically coupled with a respective quench circuit of said plurality of quench circuits, each said microcell configured to generate a digital pulse signal in response to photons generated by said scintillator layer, and each said respective quench circuit comprises a quench resistor configured to exhibit a substantially constant resistance over a selected temperature range, wherein said at least one quench resistor comprises at least one first resistor configured to exhibit a primary positive temperature coefficient of resistance and at least one second resistor configured to exhibit a primary negative temperature coefficient of resistance.

13. The radiation detector module of claim 12, wherein the solid state photomultiplier is configured to sum the respective digital pulse signals to generate a summed signal.

14. The radiation detector module of claim 12, wherein the digital pulse signal is generated in each said microcell in response to an initial analog signal exceeding a threshold voltage or current.

15. The radiation detector module of claim 12, wherein said plurality of microcells comprises a plurality of avalanche photodiodes.

16. The radiation detector module of claim 12, wherein said plurality of avalanche photodiodes comprises between about and including 100 microcells per square millimeter (mm) and about and including 2,500 microcells per square millimeter (mm).

17. An imaging system for detecting radiation from a radiation source, the imaging system comprising:
a detector panel comprising a plurality of solid state photomultiplier modules, each solid state photomultiplier module of said plurality of solid state photomultiplier modules comprising a plurality of microcell circuits, each microcell circuit of said plurality of microcell circuits comprising a photodiode responsive to radiation from the radiation source and a quench circuit configured to exhibit a substantially constant resistance over a selected temperature range, wherein said at least one quench resistor comprises at least one first resistor configured to exhibit a primary positive temperature coefficient of resistance and at least one second resistor configured to exhibit a primary negative temperature coefficient of resistance;
a data acquisition system configured to acquire output signals from said detector panel, wherein the output signals are derived using digital pulses aggregated over respective solid state photomultiplier modules;
an image reconstruction and processing system configured to generate images based on the output signals acquired by said data acquisition system; and
at least one image display workstation configured to display the generated images from said image reconstruction and processing system.

18. The imaging system of claim 17, wherein said imaging system comprises one of a positron emission tomography (PET) imaging system, a single photon emission computed tomography (SPECT) imaging system, and an X-ray based imaging system.

19. The imaging system of claim 17, wherein the radiation source includes a material for an oil/gas drilling system.

* * * * *